(12) United States Patent
Rokhvarger et al.

(10) Patent No.: US 7,632,784 B2
(45) Date of Patent: Dec. 15, 2009

(54) SINTERED CERAMIC COMPOSITE LEAD WITH SUPERCONDUCTIVE NANO-ARCHITECTURE

(76) Inventors: Anatoly E. Rokhvarger, 1280 E. 12th St., Apt. 4C, Brooklyn, NY (US) 11230; Lubov A. Chigirinsky, 3741 Mermaid Ave., Brooklyn, NY (US) 11224

( * ) Notice: Subject to any disclaimer, the term of this patent is extended or adjusted under 35 U.S.C. 154(b) by 284 days.

(21) Appl. No.: 10/826,001

(22) Filed: Apr. 17, 2004

(65) Prior Publication Data

US 2005/0255680 A1 Nov. 17, 2005

(51) Int. Cl.
*H01L 39/12* (2006.01)
*H01B 12/00* (2006.01)
*C04B 35/50* (2006.01)

(52) U.S. Cl. .............. 505/500; 505/230; 505/231; 505/234; 505/430; 505/434; 505/470

(58) Field of Classification Search ......... 428/403–405, 428/930, 701–702; 505/124, 230, 400, 470, 505/704–705, 727, 739, 779, 785, 430–431; 174/125.1; 29/599; 427/62; 438/510; 252/500, 252/518.1, 519.1

See application file for complete search history.

(56) References Cited

U.S. PATENT DOCUMENTS

| | | | | |
|---|---|---|---|---|
| 5,529,981 A | * | 6/1996 | Holloway | ............... 505/400 |
| 5,578,325 A | * | 11/1996 | Domb et al. | ............... 424/501 |
| 5,660,774 A | * | 8/1997 | Stangle et al. | ............... 505/425 |
| 5,866,515 A | * | 2/1999 | Dorris et al. | ............... 505/230 |
| 6,010,983 A | * | 1/2000 | Topchiashvili et al. | ...... 505/500 |
| 6,239,079 B1 | * | 5/2001 | Topchiashvili et al. | ...... 505/230 |
| 6,617,284 B1 | * | 9/2003 | Rokhvarger et al. | ......... 505/500 |
| 6,755,886 B2 | * | 6/2004 | Phillips et al. | ............... 75/346 |
| 2005/0277543 A1 | * | 12/2005 | Takahashi et al. | ........... 502/100 |

FOREIGN PATENT DOCUMENTS

WO    WO 03/102091    * 12/2003

* cited by examiner

*Primary Examiner*—Stanley Silverman
*Assistant Examiner*—Kallambella Vijayakumar
(74) *Attorney, Agent, or Firm*—I. Zborovsky

(57) ABSTRACT

A sintered high temperature superconducting (HTS) ceramic electric lead formed as three-dimensional (3D) HTS macro-ceramic solid product with honeycomb-like superconductive nano-architecture comprises substantially uniformly aligned nano-size HTS ceramic crystal grains, silicate glass nano-thick films, and nano-size silver and/or inorganic dots that locate in nano-thick boundary areas of the superconductor ceramic crystal grains, and the nano-size films or dots provide honeycomb-like 3D nano-size network within the 3D HTS macro-ceramic solid product or HTS ceramic lead, and the electric lead is superconducting at liquid nitrogen cooling temperature. The superconductive nano-architecture facilitates or controls substantially higher electro-magnetic and consumable mechanical properties, reliability and durability of the HTS ceramic electric leads.

7 Claims, 9 Drawing Sheets

SINTERED CERAMIC COMPOSITE LEAD WITH SUPERCONDUCTIVE NANO-ARCHITECTURE

BACKGROUND OF THE INVENTION

In 1986 two IBM scientists received the Nobel Prize in Physics for synthesizing copper-content-multi-oxide ceramic crystals that have vast electric current carrying capability/capacity ($JA/cm^2$) at a significantly increased and therefore easily achievable cooling temperature, for example, at inexpensive liquid nitrogen (LN) coolant ambience. Indeed, higher electrical current density results in proportionally decreased cross-section and consequently cost, size and weight of the advanced current lead and appliances using this lead. Therefore, since 1986, many scientists and engineers have tried to utilize High Temperature Superconductor (HTS) ceramics in HTS electric wire and other macro leads for the electrical energy transmission and application industries.

When electric current passes through regular (copper) wire the act of overcoming the "normal" resistance has two negative effects—one is that power is consumed as it is needed to overcome the resistance and, in doing that, the other is that heat is generated. Superconductivity of metal alloys (at expensive liquid helium temperature) and single ceramic crystals (at inexpensive liquid nitrogen temperature) means that at certain low temperature electricity can pass through wire or another lead meeting only insignificant (near zero) resistance and heat generation.

While homogeneous metal alloy superconductors can be easy scale-up with the same superconductivity, shaped masses of superconductor ceramic nano-crystal pluralities or granular superconductors do not keep superconductivity of the single crystals.

Therefore, to have certain current carrying capability, HTS granular ceramic lead has to be sintered with certain superconductive nano-architecture of the ceramic composite body.

Our practical goal is, using off-the-shelf available HTS ceramic powder particles, to nanofabricate and use an advanced, inexpensive, durable and reliable HTS ceramic composite lead, which achieves much higher electric current carrying capability than current carrying capability of the ordinary copper lead at room temperature $J=200$-$500$ $A/cm^2$ (copper and silver are equally the best known and most used leads).

Additionally, material superconductivity should realize three unique phenomena that allow magnetic propulsion (levitation of heavy objects), increased precision of electrical current measurements (much higher sensitivity and precision of electrical and electronic systems and devices), and electrical energy collection and long-term storage using superconductor magnetic energy storage systems.

HTS ceramics are very chemically active, brittle and degrade under environmental influences. These scientific and engineering problems are overcome in our U.S. patented and partly published ceramic-silicone processing (CSP) method and HTS-CSP composite material, which is suitable for cost-effective fabrication of HTS-CSP strands and surface coated and three-dimensional HTS-CSP leads[1-6]. Meanwhile, these inventions and publications did not consider nano-structure and nano-architecture of the HTS-CSP material and an influence of said nano-structure and nano-architecture on material quality.

Our newly invented specific superconductive nano-architecture of the previously invented[1-6] HTS-CSP material and macro leads is very important. Controlling this superconductive nano-architecture, we can control and improve quality of said HTS-CSP material and leads. Some features of the newly invented superconductive nano-architecture of the sintered superconductor composite ceramic material and macro leads from this material were recently published[7-9]. However, they were published within twelve months before this patent application.

SUMMARY OF THE INVENTION

High temperature superconductor (HTS) macro material and electrical current leads from this material can be produced employing recently invented ceramic-silicone processing method (CSP)[1-6]. HTS-CSP nanotechnology provides cost-effective production of superconducting ceramic wire and various electric current leads for everyday industrial application at inexpensive liquid nitrogen temperature using off-the-shelf-available superconductor ceramic fine powder particles, such as YBCO ceramics, and standard chemicals including an inexpensive silicone polymer additive and toluene solvent with a small percentage of silver powder dope.

We have determined that superconductive behavior, mechanical, durability and $JA/cm^2$ characteristics of HTS-CSP macro leads can be controlled and improved by controlling and improving nano-scale architecture of the ceramic macro products. The nano-architecture is the result of the chemically controlled self-assembling of the three dimensional nano-structure, which meets a set of suggestions of controversial and incomplete Nobel Prize winning physical superconducting theories that considered the collective behavior of the solid and integral compacted mixture comprised of two pluralities—superconductor and non-superconductor nano-size components.

We altogether invented the sintered ceramic composite lead with 3D superconductive nano-architecture and a method of production of the lead, comprising the silicone additive tailored thermo-chemical nanofabrication of the 3D superconductive nano-architecture comprising:

(A) a physical-chemical phase composition consisting of:
nano-size superconductor ceramic grains composed of crystals and forming a basic phase elements;
additional phase elements constituting nano-thick multi-oxide silicate glass films distributed within grain boundary areas between said grains;
further phase elements selected from at least one group consisting of nano-size dope particle, modifier particle, and impurities particle groups, and a combination thereof and said further phase elements are distributed within said grain boundary areas between said grains; and (B) a three dimensional grain-cell nanostructure comprising 3D setting network and consisting of:
said crystals with c-axes oriented substantially perpendicular to a direction of an electric current flux in said lead;
said crystal grains substantially uniformly aligned in a-b crystallographic planes; and
said additional phase elements and said further phase elements caging and framing said nano-size superconductor ceramic grains and forming nano-size cells comprising said grains surrounding by said additional and further phase elements and providing settings of said grains.

c, Nano-, d, micro-, and e, macro-scale images of the sintered HTS-CSP layer coating the $Al_2O_3$ substrate plate.

f, Sintered HTS-CSP composite layer coating a nichrome substrate strand.

As the result of the provided magnetic orientation, direction of the crystallographic axes c of the YBCO crystals coincide on the Figures b-e with z-axes of the coordinate systems. Consequently a-b planes of crystal grains are orthogonal to c-axes.

FIG. 3. AFM analysis of the grain architecture of the sintered HTS-CSP layer coating $Al_2O_3$ substrate plate.

a. At nano-size scale. b, At micro-size scale.

Figure 4A:
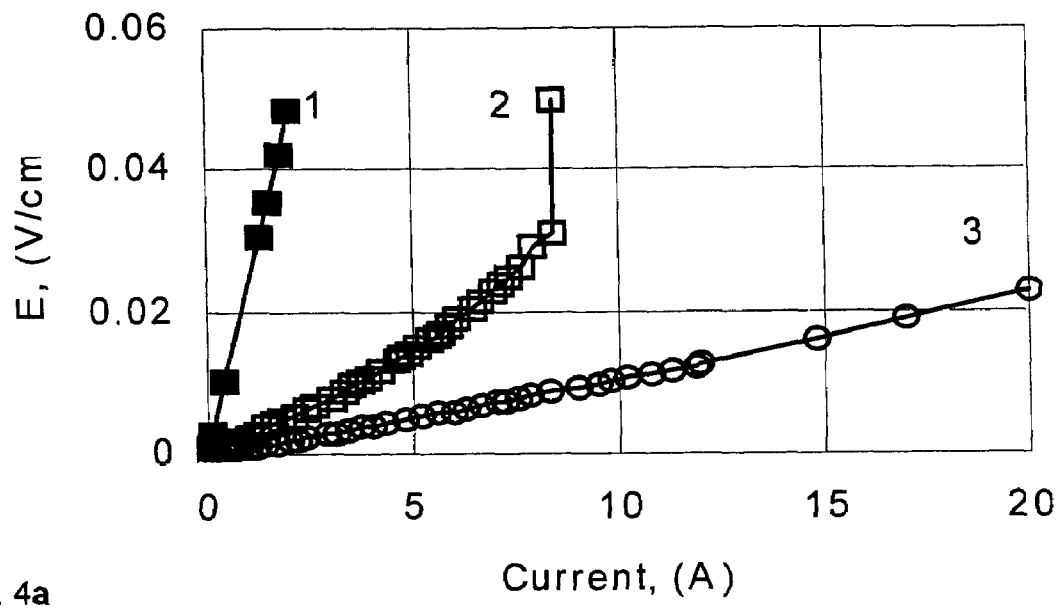
Figure 4B:
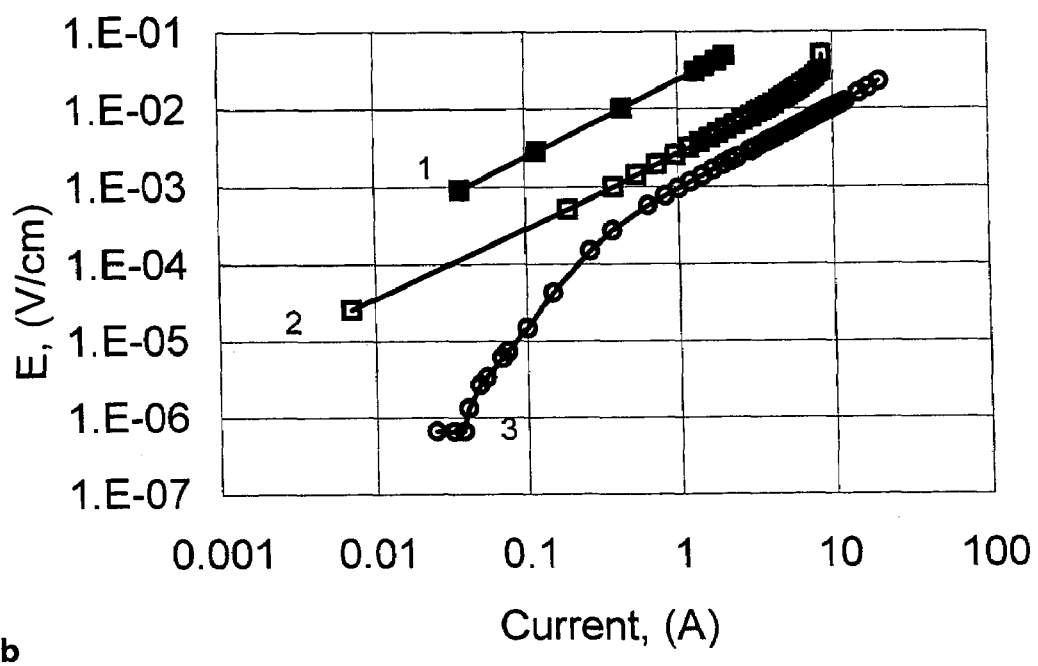

FIG. 4. E-I behavior of HTS-CSP wire using silver substrate strand.

a, Silver strand tested at 300K (graph # 1) and at 77K (graph # 2) and similar silver strand coated with HTS-CSP sintered compound and tested at 77K (graph # 3). b, The same (see FIG. 4a) E-I measurement data submitted in logarithmic scale axis.

Figure 5:
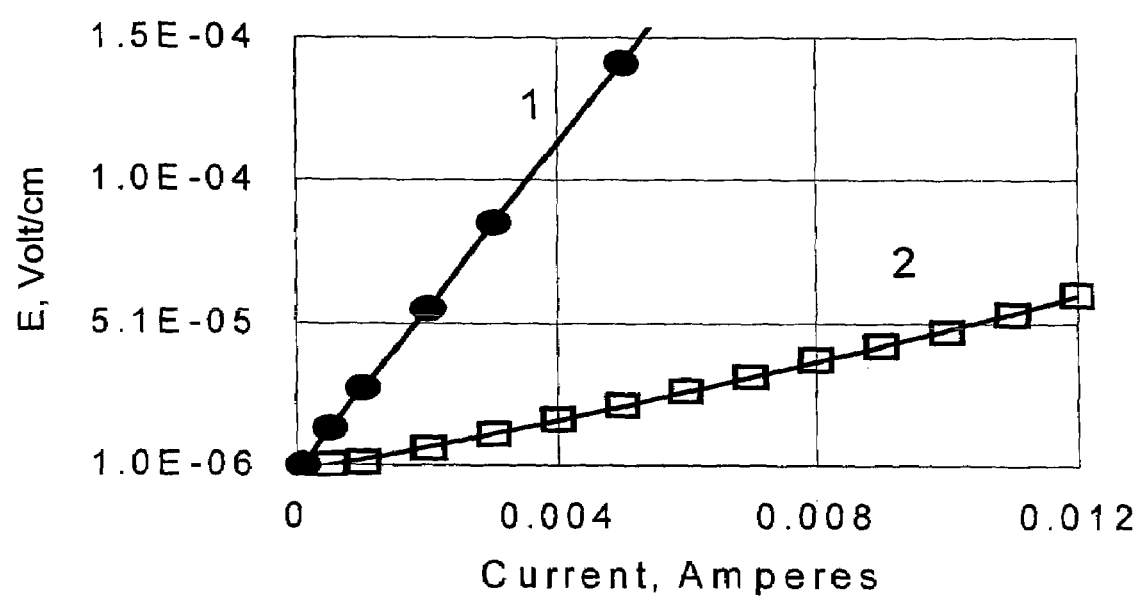

FIG. 5. E-I behavior at 300K (graph # 1) and at 77K (graph # 2) of adhesion coated and sintered HTS-CSP strand using NiCr substrate strand of 50 µm in diameter.

Figure 6:
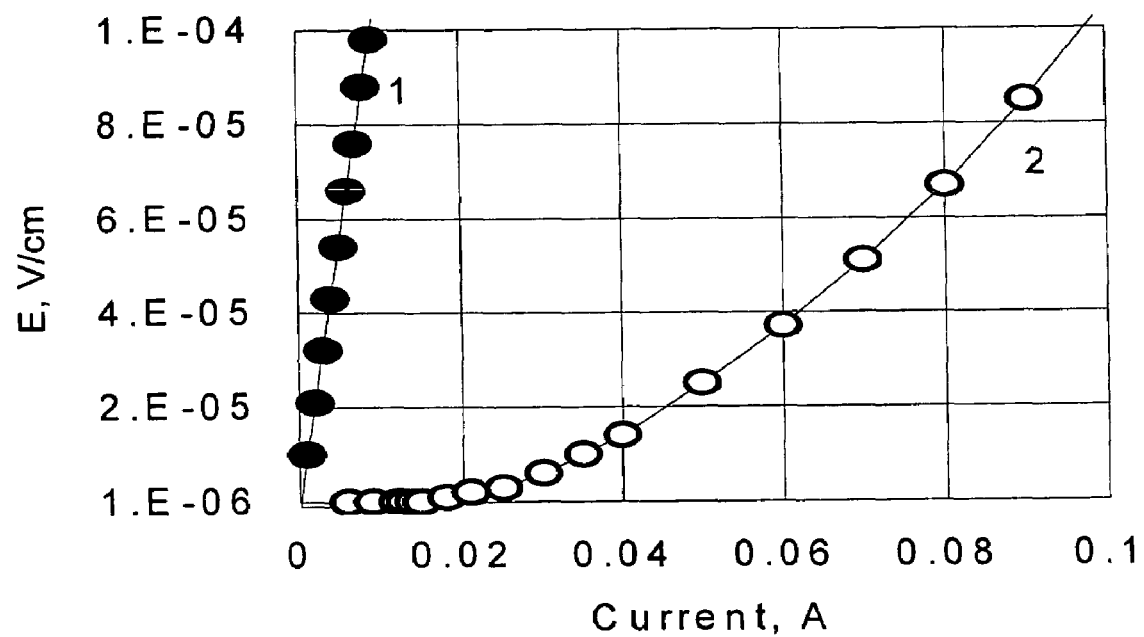

FIG. 6. E-I behavior at 300K (graph # 1) and at 77K (graph # 2) of dry pressed and sintered HTS-CSP tablet.

Figure 7:
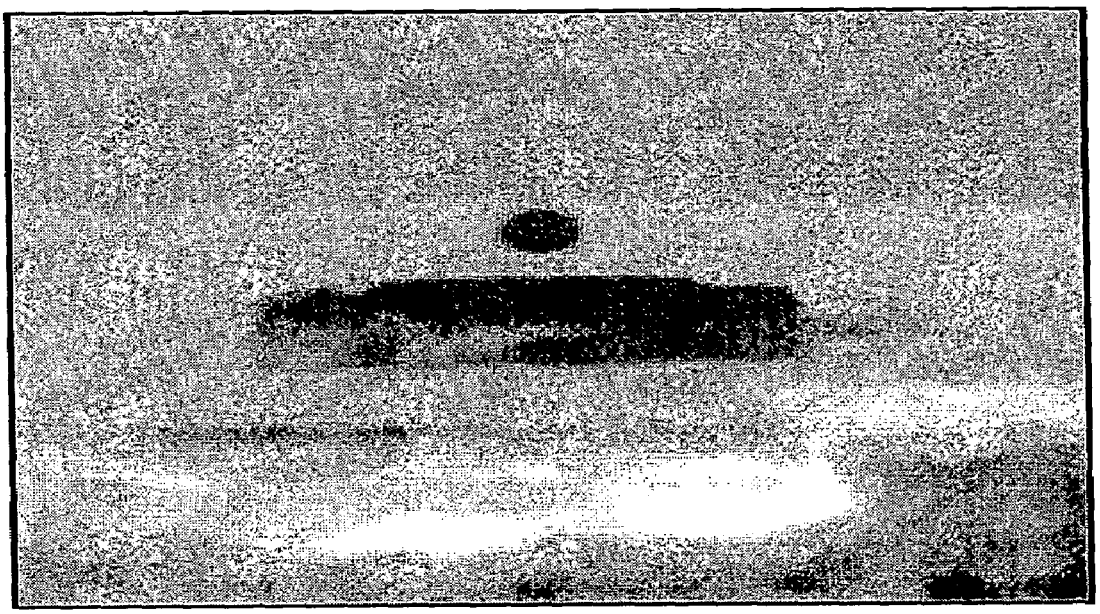

FIG. 7. Photo picture showing magnetic levitation effect provided by dry pressed and sintered HTS-CSP tablet.

The rare-earth magnet (0.225 g, 5 mm in diameter) levitating in air, 7 mm above a dry-pressed and sintered HTS-CSP tablet of 30 mm in diameter immersed in liquid nitrogen.

Figure 8:
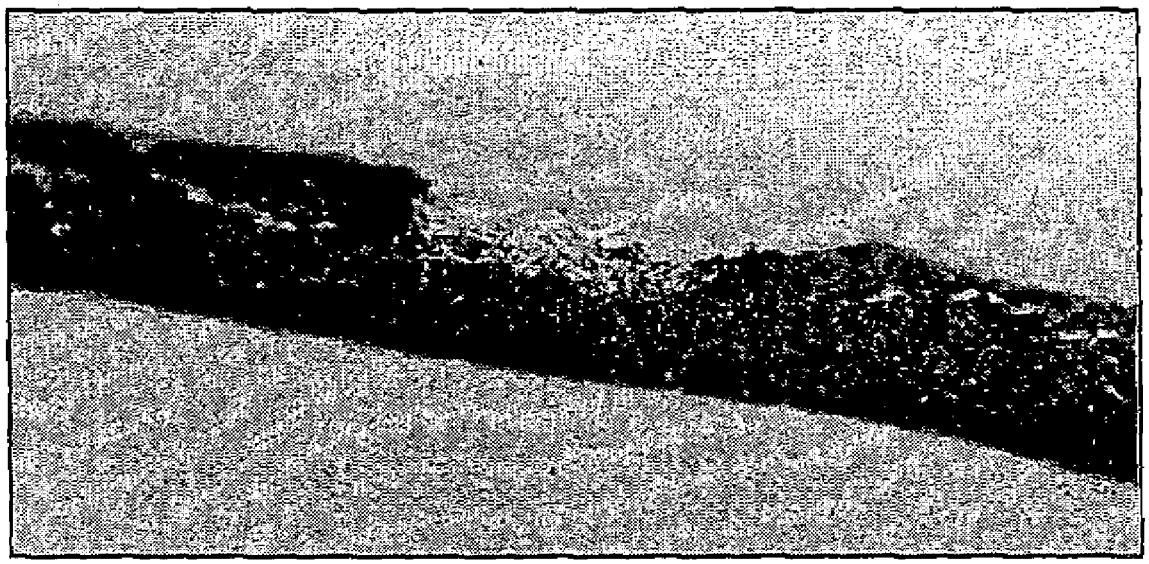

FIG. 8. Magnified photo picture showing construction of HTS-CSP strand.

A flexible HTS-CSP strand uses a silver substrate strand of 127 µm in diameter where a part of the HTS-CSP adhesion coated and sintered HTS-CSP layer of ~10 µm thickness was intentionally removed to demonstrate HTS-CSP strand construction.

Figure 9:
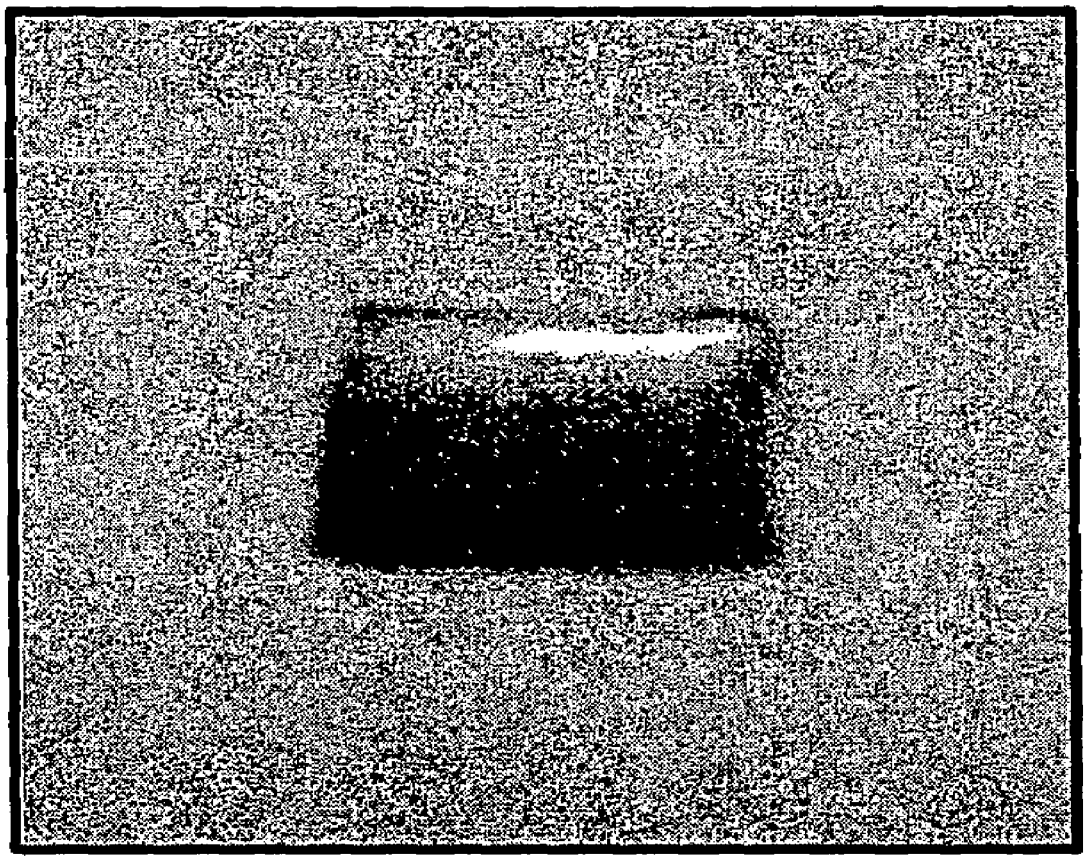

FIG. 9. Photo picture showing HTS-CSP slip cast formed and sintered HTS-CSP plate, 20 mm×20 mm plan size.

DESCRIPTION OF THE PREFERRED EMBODIMENTS

Predecessor Techniques

The 18 year long promise of the Nobel Prize-winning discovery of High Temperature Superconductor (HTS) ceramic particles (Bednorz and Muller[10]) until now has not been utilized in engineering leads[11-15], primarily electric wire, which would work at relatively inexpensive liquid nitrogen (LN) temperature 77K and compete with ordinary copper wire, which transfers without significant heat losses at room temperature 200-500 A/cm² where 200 A/cm² is most common.

Meanwhile three types of engineering methods of HTS wire production were developed. All of them intend to produce electric current carrying tape employing either jewelry/metallurgical or mechanical or physics methods and silver and/or expensive rare-earth oxide composite substrates and silver isolation/sheathing materials. These developments are reflected in several hundred patents and publications while we are citing just a few of them.

The first and second methods have been named as 'the first generation' of the HTS wire technology. The first method that was developed was the oxide-ceramic-powder-loading-in-silver-tube method with subsequent rolling/dying of the silver tube to align and orient bulk loaded HTS ceramic particles[14-17]. The second method is the ceramic-particle-cladding-on-silver-tape method with subsequent drying and firing of the friable and non-oriented/organized ceramic mass[18-20]. Both methods have failed commercially due to relatively high quantity and consequently high cost of the silver used and technically unavoidable quality restrictions including the high probability of the interruption of the electric current flow by unavoidable cracks, pores and voids of the whole ceramic body. In general, both methods do not provide superconductive nano-architecture of the multi-grain ceramic macro material and wire leads.

The third method, which was named as 'the second generation' of the HTS wire technology, is comprised of depositing either atoms or molecules onto expensive and much thicker multi-layer metal oxide template tapes and in-situ assembling from these atoms or molecules HTS ceramic crystal layer films[21-25]. All modifications of this "template-film-coating" method are expensive and have the same two unavoidable technical disadvantages.

The first one is the engineering insignificant distance of depositing film thickness (<0.5 µm) within which vertical forces of the template can provide the epitaxial orientation and alignment of the ceramic crystals onto this template. These make the film-coating method inherently impractical for design of everyday electrical engineering leads as its cost is incompatible with continuous copper wire of a few mm in diameter. For example, 0.3 µm-thick HTS film, which coats 1 mm-thick multi-layer alloy substrate could transfer $10^6$ A/cm². If so, the engineering estimation being provided for the total cross-section of the platinum-like-expensive tape will result just in the equivalent copper-like carrying capacity 333 A/cm².

The second technical and cost disadvantage of the "template-film-deposition" technique, including metal-organic deposition (MOD) process[24], is a necessity in relatively thick nobel metal protection layer (expensive protection) covering strip/tape coating layer, which is not sintered and therefore chemically active.

All previous techniques, publications and discussions did not consider and use design and fabrication methods of three dimensional superconductive nano-architecture of the sintered HTS ceramic composite leads. As the result, all mentioned above techniques and their modifications could not bring on the market any HTS ceramic wire with quality and technical characteristics that will make these HTS wires cost and quality competitive with ordinary copper wire applications.

Design of the Superconductive Nano-Architecture of the Sintered Ceramic Composite Leads As the leverage component and a unique feature of the created material formulation[1-6], we use silicone oligomer, poly-dimethylsiloxane HO—[—$Si(CH_3)_2O$—]—H combined with a thermal polymerization aid. During polymerization and firing processes, this unique additive can chemically control the ceramic thermal treatment, including sintering, and desirable nano-phase transformation and 3D nano-texture evolution.

Guided by physical theories[26-29] and nanofabrication methods[30-33], we created and applied in a lab the ceramic-silicone nano-processing (CSP) method[1-6], which reliably brings the superconductivity of off-the-shelf available HTS ceramic powder particles[34] to engineering usable and versatile customizing macro-ceramic leads including continuous and flexible electric strands. Below we consider the specific superconducting nano-architecture of the sintered macro-material when this nano-architecture comprises the theoretically suggested combination of certain ceramic grain texture and physical-chemical phase composition.

The silicone polymer 3D-matrix scaffold should govern homogeneous and uniform nano- and micro-size incorporation, assembling and organizing YBCO ceramic nano- and micro-particles within, resulting nanofabricated structure-directing and self-assembling 3D superconducting architecture[26-32] of either adhesion coating layers[37-39] or slip/tape cast or bulk HTS-CSP leads. There appears highly ordered granular nano-, micro-, and macro-hierarchical 3D structures[40], where superconducting nano-grains are segregated from each other and framed by much smaller non-superconductor nano-thick-film and nano-particle impurities and dopes. They are comprised of multi-metal-oxide silicate glasses (insulators) and silver dope nano-particles (conductors) that can help macro superconductivity of the HTS-CSP ceramic body mobilizing magnetic vortices[26, 35] are working as pinning centers.

This 3D topology of certain physical-chemical phases are suitable for Josephson and weak link tunneling[42], percolation[35], gossamer superconductivity[42], and proximity[43] macro-state effects between YBCO superconducting grains making superconductive[44] whole samples of HTS-CSP leads.

Long-term discussions reflected in [26-29, 35, 36, 41-47] allow assuming that at 77K a particular electric current impact on each single YBCO crystal and/or crystal grain can simultaneously activate certain superconductor states as well as metal-conductor and insulator states of the same crystal grain. These states are unstable and partly reversible and their activities are varied depending on individual crystal morphology, material composition and nanostructure, and the density $JA/cm^2$ of the supplied electric current. The same electric current impact can also induce superconductive tunnel junctions (super-current) through metallic, semiconducting and insulating states within individual superconducting grains.

The gradual increase in supplied J correspondingly increases numbers of quantum variable YBCO crystals and non-reversible quenches from superconductor to normal states and between other superconductor states[35, 41-47], establishing the implicative superconductivity or the mixing "superconductor/metal-like" state of the HTS-CSP articles. This mixing nature of the electrical conductivity is the specific feature of the HTS-CSP macro leads allowing an additional electric energy throughput at low values of E and insignificant heat dissipations and electric energy losses[45].

The supplied electric current is spontaneously distributed within the cross-section of the whole HTS-CSP macro-article in agreement with Kirchoff's first law and corresponding to variable channel resistances working in parallel in their bottleneck cross-sections. These also relate to the normal state channels of the HTS-CSP strand comprised of the metal conductive core substrate strand and the network of silver dope nano-particles incorporated into the 3D regular network of nano-thick multi-metal-oxide silicate glass-films and dots in grain boundary areas having different conductivity. All of them simultaneously provide normal metal and superconductive state percolation effects. Meanwhile the 3D uniform and homogeneous network of interfacial silicate glass nano-size impurities forms a 3D matrix of the vortex-pinning centers that governs type II superconductivity of the sintered ceramic body and significantly contributes engineering superconductivity to 3D HTS-CSP material and macro-products.

Thus, provided design shows a necessity to nanofabricate three dimensional superconductive nano-architecture of the HTS ceramic leads produced from off-the-shelf available $YBa_2Cu_3O_{7-x}$ (YBCO) ceramic fine powder particles tailored (nanofabricated) via combined physical-chemical and nano-structural control of superconducting and mechanical properties and durability of the sintered and 3D-shaped ceramic bodies of the novel and inexpensive superconductor products.

Nanofabrication of Sintered Ceramic Composite Leads with Superconductive Nano-Architecture The HTS-CSP raw material formulation[1-6] uses three major components: HTS ceramic powder, liquid silicone additive and silver or another dope or dope-additive combination. HTS-CSP nanotechnology preferable employs off-the-shelf-available $YBa_2Cu_3O_{7-x}$ (YBCO) fine powder consisting ceramic particles[34] that we used as the major component of the material formulation and HTS-CSP nanotechnology. Aggregated YBCO nano- and micro-particles have a mean size value ~0.7 μm with prevailing orthorhombic morphology[34]. YBCO is now the most favorable HTS multi-oxide ceramic material[20-26].

The polymer additive we used is synthetic liquid silicone with a molecular weight in the range of 30,000-40,000, HO—[—Si(CH_3)_2O—]—H. Silicone additive plays a dozen synergetic technological roles and guides both structural evolution and material phase transformation providing both HTS-CSP process and quality control.

As the third component, we use silver nano-powder dope (~2.5 wt %) while we later more or less successfully tested several other dopes and their combinations. As a suspension solvent medium, we used toluene.

The HTS-CSP nanotechnology employed nano-science methods of [26-32] and is comprised of three technological stages incorporating specially developed steps marked below by the asterisk sign*.

1. YBCO and silver dope fine powder are loaded in the silicone-toluene solution. Applied ultrasonic vibration* disperses the ceramic particle aggregates up to nano-crystal-grains and homogenizes the multi-component ceramic-silicone suspension/slurry*.

2. Versatile nano-forming can be provided, such as:
(i) Extrusion, injection-molding or cold/dry pressing of the dried nano-suspension mass*;
(ii) Slip/tape cast molding of the nano-suspension in a plastic mold or on a plastic surface to form inflexible HTS-CSP articles*; and
(iii) Self-controlling adhesion coating* using silicone adhesive properties to bind[36-38] YBCO particles with each other and with metal or alloy or ceramics or quartz glass substrates in various geometrical forms, including fibers and fabrics.

Adhesion forming methods are utilized in:
a) spin or dip coating to produce flexible round strands for multi-strand twisted wire, tape, and coil*;
b) spraying or painting or brushing substrate surfaces of any perimeter or shape*; and
c) ink printing or drawing 2D and 3D circuit schemes*.
Additionally, we provide magnetic grain orientation* of HTS ceramic nano-particles embedded in a viscous polymer mass using permanent magnets of ≦0.3 T.

3. Thermal processing of the formed articles in a tube furnace makes possible conveyor manufacturing of continual wire. The sizes of the macro-samples were limited by the size of the lab tube furnace with a multi-step programmable controller (<1200° C., inner diameter 37 mm, working zone length ~6 cm; Carbolite Co., WI, USA). We also attached an oxygenation system with a flow-meter to the furnace tube.

The slow thermal polymerization heating up to 250° C. of the silicone filled with YBCO nano-particles* viscous mass results in texturing previously magnetically oriented YBCO ceramic nano-particles into a 3D cross-linked hierarchical structure*. Then using an original thermal treatment mode*, we provide slow heating up to ~600° C. to burn out the organic part of the silicone additive and then very fast material heating and incongruent-melt-fully-dense-sintering* at 930° C.-950° C. Next stage is cooling including a several hours-long thermal oxygenation* of the sintered HTS-CSP macro-articles at ~450° C.

We produced and tested hundreds of HTS-CSP samples and employed various forming methods to study capabilities of the HTS-CSP material formulation.

Silicone Controlled Phase Transformation

Silicone polymer additive comprises 2.5-5 wt % of the total raw composition weight. After polymer organic burn out and up to ceramic firing temperatures silicone polymer residuals temporary exist within the ceramic body in a very chemically active and unstable form, —Si—O—.

These residual forms are a sintering aid. They decrease firing temperature reacting with a small part of YBCO crystals and silver dope nano-particles and producing silicate glass liquid eutectics $Ba_2SiO_4$ enriched with Y, Cu, and Ag oxides. Such type of ceramic sintering is named incongruent melt sintering. Decreasing firing temperature, we keep initial YBCO crystal sizes and morphology, which is very important for macro-superconductivity of the HTS-CSP products. The nano-thick films of liquid silicate glasses fill grain-boundary nano-size gaps inducing the capillary forces that join together YBCO grains thus shrinking and sintering the material body and making it, after hardening, fully dense and integrated. This is very important since the ceramic body integrity prevents an interruption of the electric current flux in HTS-CSP leads. The produced silicate glass nano-thick film structure also significantly improves ductility and other mechanical properties of the HTS-CSP leads.

Produced nano-thick silicate glass films as well as silver dope nano-particles surround sintered YBCO grains making HTS-CSP material more reliable, durable and chemically inert. This and ceramic sintering make HTS-CSP leads chemically stable in both open air and LN environments excluding the use of expensive silver covering or sheathing, as is required by other techniques[14-25]. For example, during the last five years we demonstrated equal volt-ampere characteristics and levitation of several unprotected and non-insulated HTS-CSP strands and bulk lead samples that continuously contacted with lab room air and water steam.

Different oxygen content of the YBCO crystals results in different superconductivity of YBCO grains. Indeed, only $YBa_2Cu_3O_7$ orthorhombic crystals become superconductive at $\geq 77K$ while $YBa_2Cu_3O_6$ tetragonal crystals are insulators. A subscripting stoichiometric coefficient at the oxygen atom in the formula $YBa_2Cu_3O_{7-x}$ is a statistical estimation of the mean value of the oxygen content in the actually supplied particles[34] and in the range $0 \leq x \leq 0.3$ an impact of the plurality of the $YBa_2Cu_3O_7$ crystals should be enough to demonstrate the superconductivity of the sintered HTS-CSP leads at 77K[34, 35]. During the heating, the green YBCO-silicone compound loses ~7.5 wt. %, which includes non-reversible gases of the burning silicone additive and oxygen of YBCO ceramics while the sintered HTS-CSP composite loses ~2.2 wt % of its weight determining the thermodynamically reversible oxygen, which is responsible for rebuilding orthorhombic crystal morphology. There is an amount of oxygen, which is inserted back in YBCO crystals during the thermal oxygenation treatment of the HTS-CSP lead providing at ~450° C.

Figure 1:
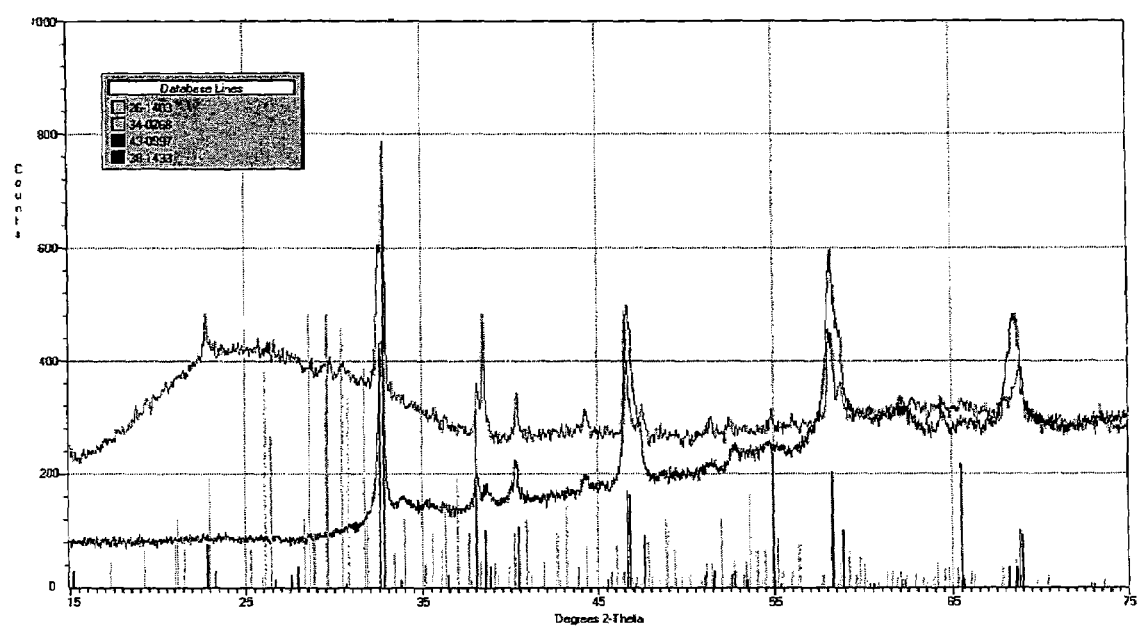
FIG. 1. Comparison of two X-ray diagrams.
Lower spectrum relates to polymerized silicone filled with YBCO particles and upper spectrum relates to sintered HTS-CSP material.

FIG. 1 provides a comparison of two X-ray diagrams. The lower spectrum relates to polymerized silicone with nano-particles of YBCO and Ag dope embedded in the polymer matrix, where the amorphous silicone induces a wave at the right part of the diagram. The upper spectrum relates to the sintered HTS-CSP compound with a wave induced by amorphous silicate glasses at the left edge of the diagram. The major peaks of both X-ray diagrams of FIG. 1 relate to crystalline oriented YBCO ceramics supplied by [34]. Both diagrams in FIG. 1 identify silver consequently either in the form of dope nano-particles or as a component of the silicate glasses.

Silicone Controlled Nanostructural Evolution of HTS-CSP Leads

As determined[26, 35], the proper YBCO grain orientation and alignment should result in an increase of 50-100× in the electric current throughput of HTS-CSP leads and optimize YBCO grain pre-packaging density resulting in full material density. To obtain these advantages, we provided a magnetic impact on an adhesion coated green mass[3] or a just formed slip cast ceramic composite lead where certain viscosity of the green ceramic body allows rotation of the YBCO grains in a magnetic field, for example, 0.3 Tesla. Crystal-axis rotation of YBCO grain particles orients them in a-b planes of the crystal lattices and along electric wire or along the major vector of the electric current lead while the longer c-axes of the crystals become oriented in perpendicular to the designed electrical current flux direction.

The silicone polymerization and the organics burn out processes keep, stabilize and homogeneously and uniformly organize the previously magnetically provided orientation and alignment of the YBCO grains. Following incongruent melt fast sintering also does not destroy but rather stabilizes previously achieved YBCO crystals orientation and 3D grain nanostructure architecture.

Figure 2:
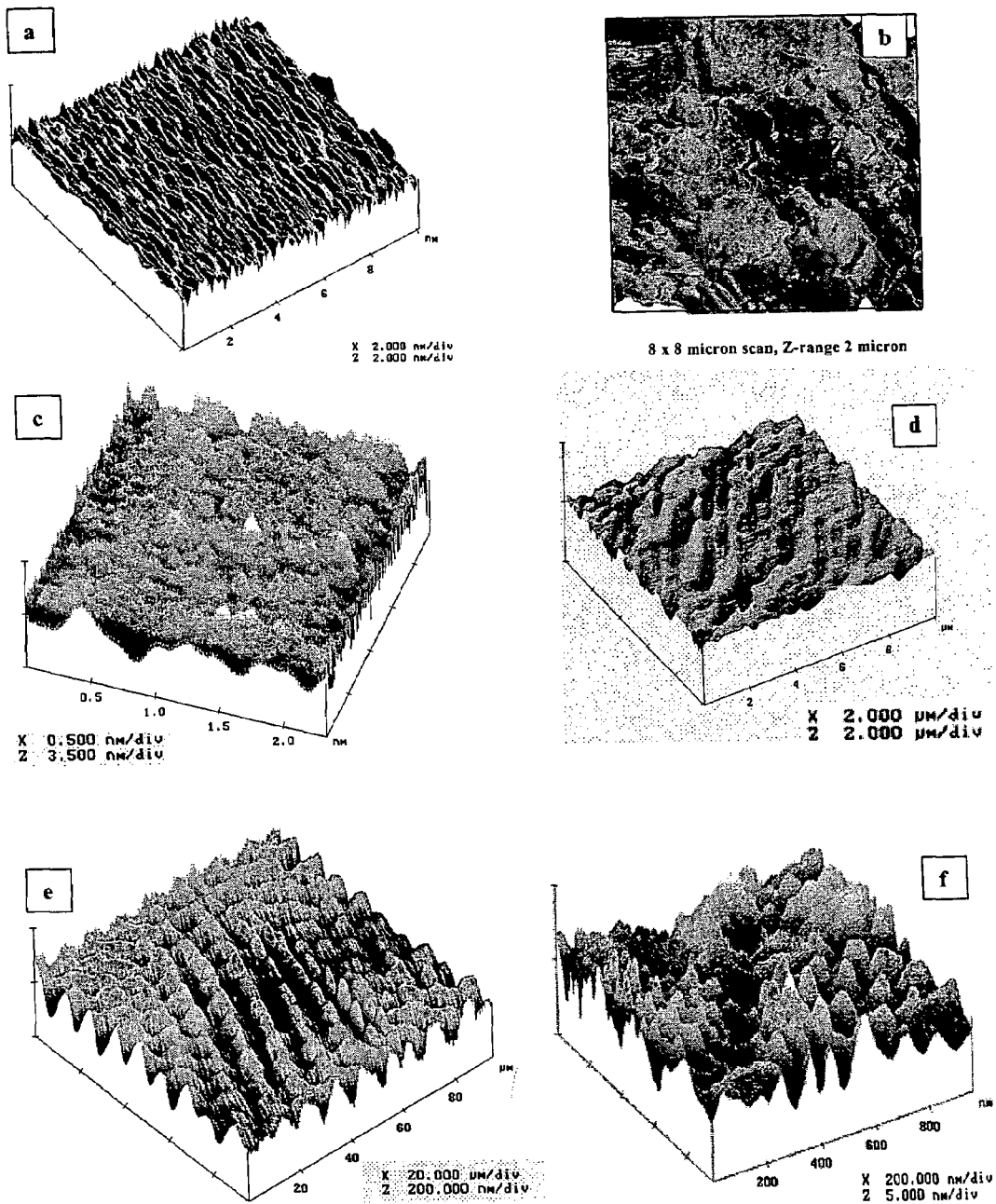
FIG. 2. Atomic Force Microscope (AFM) surface images.
a, Cross-link matrix of the thermally hardened silicone polymer.
b, Adhesion coated, magnetically oriented and then polymerized but not yet sintered HTS-CSP composite layer.

To study HTS-CSP material nanostructure evolution, which provides the HTS-CSP nanofabrication method, we used a constant force mode of Nano-Scope E-3 from Digital Instruments, Inc. USA. The nano-scale AFM image in FIG. 2a shows a surface of the polymerized silicone with the cross-linked uniform backbone matrix comprising —Si—O— inorganic chains. This matrix works as a 3D-scaffold[40], which guides YBCO ceramic grain topology organization of the HTS-CSP semi-product composite (see FIG. 2b). Correspondingly, nano-, micro-, and macro-surface images of the sintered HTS-CSP material of FIG. 2 (c-f) reflect similar 3D nanostructures, that are the results of the silicone polymer guided structural evolution.

Figure 3A:
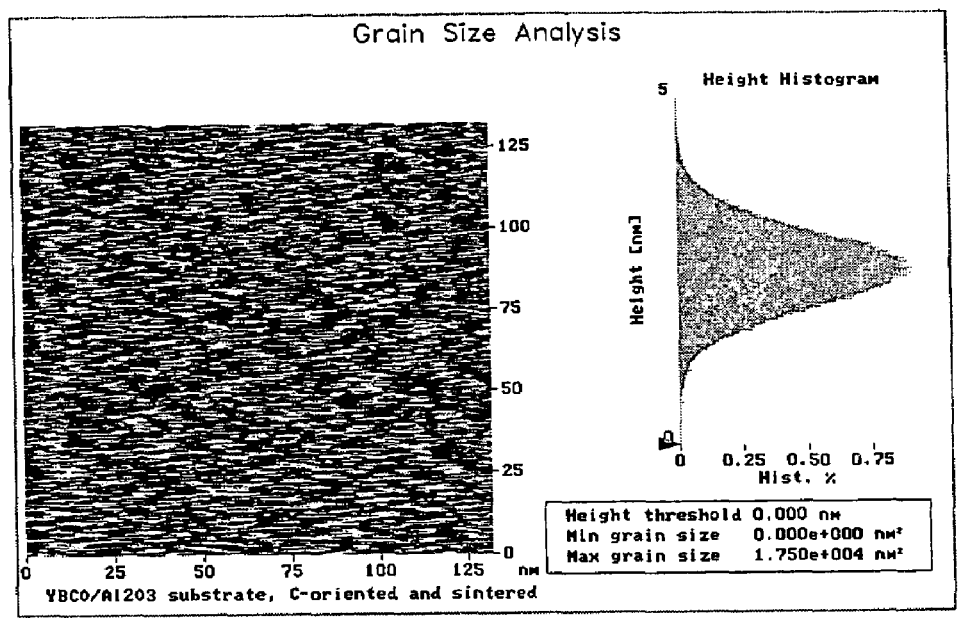
Figure 3B:
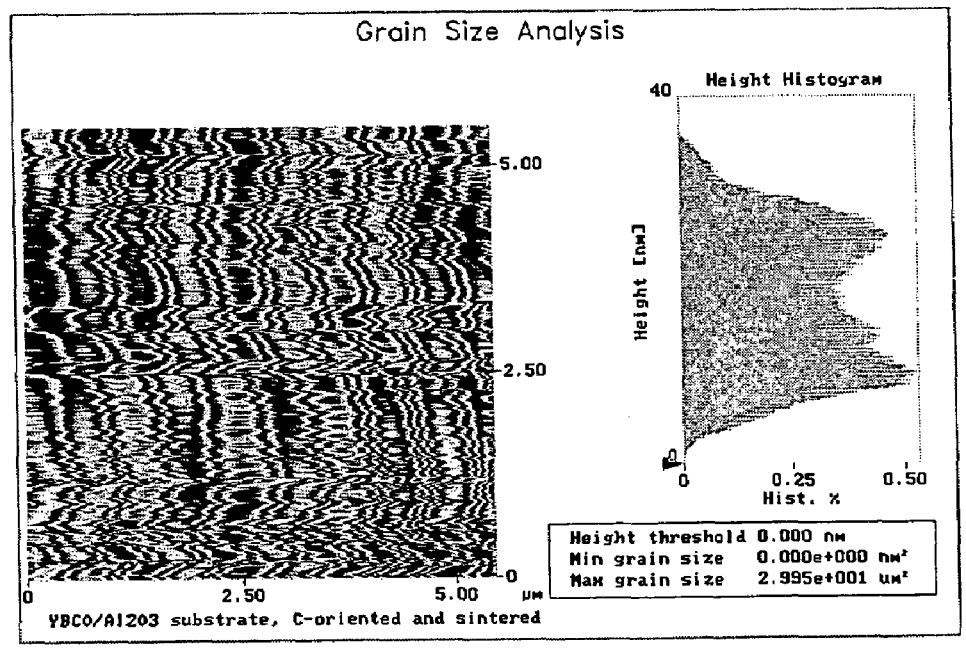

FIG. 3 demonstrates the well ordered nanostructure, which consists of homogeneously and uniformly aligned in a-b crystal planes equally sized needle-like nano-grain/crystals and micro-grain conglomerates of the studied HTS-CSP material samples. YBCO nano-crystal heights (see FIG. 3a) above the surface baseline vary in the range 2.5±1 nm while YBCO micro-grain heights (FIG. 3b) mostly vary in the range 10-25 nm. Altogether we have uniform 3D nanostructure where YBCO ceramic nano-grains are setting in silicate glass nano-film frames. Obviously, it is the best geometrical structure to provide electrical percolation and vortex pinning networks, as well as the structure, which has the best (for such compound) reliability, durability, ductility, flexibility, and machinability of the sintered HTS-CSP ceramic composite body.

Needle-like YBCO crystal grains of about 15 nm are oriented, ordered and framed by relatively plastic and much smaller nano-thick glass films and silver dope nano-particles posed in grain boundary areas. Therefore, under mechanical impacts this nanostructure makes possible grain-boundary sliding causing the enhancing fracture toughness and ductility of the HTS-CSP solid products. Indeed, we successfully machined HTS-CSP slip cast plates using a diamond saw and a drill tool.

Thus, HTS-CSP nanotechnology provides a combination of magnetic c-axis grain orientation and 3D silicone polymeric matrix scaffold organizing and fixing nano-grain alignment in a-b crystal planes. These result in a nanofabricated 3D honeycomb-like network matrix of multi-metal-oxide-silicate-glass impurities that provide both electrical percolation and a magnetic vortex-pinning effects and significantly increase superconductivity of HTS-CSP macro-products. Together with incongruent melt fully dense ceramic sintering and other impacts, these allow nanofabrication of the uniformly organized and certainly superconducting tailored 3D nanostructure of HTS-CSP macro leads and other products.

Superconductivity of the HTS-CSP Strands and Other Leads

Using the magneto-optical method[47], a study of the HTS-CSP slip cast and sintered plate determined superconductor grains and grain conglomerate areas with the critical current density $J_C \geq 10^8$ A/cm$^2$, which is a champion $J_C$ value for any known development using YBCO ceramics. This demonstrates the tremendous reserves for process and quality improvements of the HTS-CSP macro-leads.

As it determined [$^{14}$], in order to be well suited and beneficial for electrical engineering applications, novel HTS-CSP electric leads should transfer J=10-20 kA/cm$^2$ at certain low voltage, for example, E=0.001V/cm. Meanwhile, electric current carrying capability of the same or another HTS-CSP lead J=1-3 kA/cm$^2$ at, for example, E=0.0001V/cm can be well effective and suitable for electronic applications[12,49,50].

Silver substrate strands are expensive and can creep at 920° C., which is within a range of ceramic material firing temperatures. Therefore, we found and used nichrome (NiCr) alloy substrate strands as an inexpensive substrate material, which is thermally and mechanically highly resistant during sintering and oxygenation of HTS-CSP strands. If a nichrome substrate strand of 50 μm in diameter is coated by the HTS-CSP composite coating layer of ~10 μm sintering thickness, this HTS-CSP strand has the engineering effective substrate/ceramics cross-section ratio of about 1:1. Such HTS-CSP strand can transfer direct electric current of I~0.7 A or J~20 kA/cm$^2$ at 77K and insignificant E~0.005V/cm, which is a required level of the wire's current carrying capability for highly beneficial industrial applications of such advanced wire.

$YBa_2Cu_3O_{7-x}$, ceramics are a type II superconductor, which is non-magnetic material. Meanwhile bulk-formed HTS-CSP macro leads with superconductive nano-architecture demonstrate significant Meissner (magnetic levitation) effect and superconductivity due to inter-granular Josephson tunneling, percolation network and Abrikosov-Josephson magnetic flux pinning centers produced by silicate glass and silver dope nano-impurities at grain boundary areas[43,44].

Advancements of HTS-CSP Leads

Exceeding by 100× the engineering application limit J=200A/cm$^2$ of copper wire, HTS-CSP multi-strand wire would decrease the size, weight and cost of motors, cables, transformers, and generator rotors by 5-10 times[13,14,48]. HTS-CSP wire with specific superconductive nano-architecture would also replace copper cables in the existing underground trenches to eliminate bottlenecks of the overloaded grids in city areas, which is limiting the progress and growth of computerization, businesses and life-style. These features, as we believe, a cost/performance ratio C/P<$8/kA-m, which results from HTS-CSP multi-strand wire using inexpensive nichrome alloy (NiCr) substrate strands and our cost-effective nanofabrication methods, will allow HTS-CSP wire to successfully compete with ordinary copper wire having to depend on its diameter and alloy composition giving it C/P $10/kA-m≤C/P≤$55/kA-m.

HTS-CSP wire/cable/transformer distribution systems, electric current fault limiters and unique superconductor magnetic energy storage systems will be able to save up to 25% of the electrical energy produced around the world that is now lost due to heat dissipation and during "sleep" hours. They would also prevent power blackouts, such as happened on Aug. 14, 2003 impacting 50 million people in the U.S. and Canada. Additionally, the variously customized HTS-CSP bulk leads with superconductive nano-architecture can be utilized for high-speed magnetic levitation vehicles and non-noisy, non-wearing bearing and gyroscope systems.

Our HTS-CSP leads with superconductive nano-architecture are also attractive for electronics[12,49,50]. For example, at insignificant for electronics heating output and E~0.0005V/cm, the HTS-CSP strand tested at 77K transferred an electric current I~0.09 A or J=2.5 kA/cm$^2$. For example, such HTS-CSP strands can feed supercomputers. There are also possible various HTS electronic boards, circuits, and system-on-a-package devices if the sintering temperature of the HTS-CSP material, which is about 930° C., is allowed. These can reduce sizes and costs of super-precision electronic devices and sensors/detectors by 1.5-2×.

REFERENCES

[1] Rokhvarger, Anatoly E. & Topchiashvili, Mikhail I. "Superconductor Composite Material", U.S. Pat. No. 6,617,284, Sep. 9, 2003, 10 claims

[2] Topchiashvili, M. & Rokhvarger, A. "High Temperature Superconductor Composite Material", U.S. Pat. No. 6,239,079, May 29, 2001, 18 claims & 2 Drawings

[3] Topchiashvili, M. & Rokhvarger, A. "Method of Conveyor Production of High Temperature Superconductor Wire, and Other Bulk-Shaped Products Using Compositions of HTS Ceramics, Silver, and Silicone", U.S. Pat. No. 6,010,983, Jan. 4, 2000, 32 claims & 3 Drawings.

[4] Rokhvarger, A. & Chigirinsky, L. "Adhesive Coated HTS Wire and Other Innovative Materials", 104th Annual Meeting & Exposition, The Amer. Ceramic Society, Apr. 28-May 1, 2002, St. Louis, Mo., Abstr. Book, (AMF 4-P-01-2002), pp. 198-199; and pp. 375-384 in Ceramic Transactions, v. 140, Ed. A. Goyal, W. Wong-NG, M. Murakami, and J. Driscoll, *Processing of High Temperature Superconductors*. American Ceramic Society, Westerville, Ohio, 2003

[5] Rokhvarger, A., Chigirinsky, L. & Topchiashvili, M. "Inexpensive Technology of Continuous HTS Round Wire," *The American Ceramic Society Bulletin*, Vol. 80, No. 12, pp. 37-42 (2001)

[6] Rokhvarger, A. & Chigirinsky, L. "Cost Effective Technology of HTS Ceramic Filaments and Other Materials", An International Conference on Advanced Ceramics and Glasses, American Ceramic Society, PAC RIM 4, Section 4. High TC Superconductors—Novel Processing and Applications in the New Millennium, Nov. 4-8, 2001, Hawaii, Abstract book, p. 66.

[7] Rokhvarger, A. & Chigirinsky, L. "Engineering of Superconductive Ceramics", Journal Electronic Packaging), *American Society of Mechanical Engineers* (ASME), Vol. 126, #1, pp. 26-33. (March 2004)

[8] Rokhvarger, A. & Chigirinsky, L. "Novel Nanotechnology of Usable Superconductor Ceramics", 105th Annual Meeting & Exp., The American Ceramic Society, Apr. 27-30, 2003, Nashville, Tenn.—Abs. book, pp. 61-62; and pp. 163-170 in Ceramic Transactions, Vol. 148, *Ceramic Nanomaterials and Nanotechnology II*, Edited by M. R. De Guire, M., Z. Hu, Y. Gogotsi, and S. W. Lu. American Ceramic Society, Westerville, Ohio. 2004

[9] Rokhvarger, A. & Chigirinsky, L. "Unconventional Nanoparticle Technology of Superconductor Ceramic Articles", 2003 Materials Research Society (MRS) Spring Meeting, Apr. 21-25, San Francisco, Calif.—Abstract book p. 345; and pp. 49-54 in MRS Symposium Proceedings, Vol. 776, *Unconventional Approaches to Nanostructures with Applications in Electronics*, Photonics, Information Storage and Sensing, Ed. by O. D. Velev, T. J Bunning, Y Xia, and P. Yang. Materials Research Society, Warrendale, Pa., December 2003

[10] Bednorz, J. G. & Muller, K. A. "Possible High-$T_C$ Superconductivity in the Ba—La—Cu—O System," *Zeitschrift fur Physik* Vol. 64, issue 2, pp. 189-193 (1986)

[11] March, G. "Time Ripe for Superconductivity?" *Materials Today*, Elsevier Science, pp. 46-50 (April 2002)

[12] Nisenoff, M. & Rowell, M. "Superconducting Electronics." *Superconductor & Cryoelectronics*, pp. 17-26 (Summer 2001)

[13] Grant, P. M. "Superconductivity and Electric Power: Promises, Promises. Past, Present and Future." *IEEE Transactions on Applied Superconductivity*, Vol. 7, pp. 112-133 (1997)

[14] Rosner, C. H. "Emerging 21$^{st}$ Century Markets and Outlook for Applied Superconducting Products." *Advanced in Cryogenic Engineering*, Vol. 43, Ed. by P. Kittel, Plenum Press, New York, pp. 1-24 (1998)

[15] Malozemoff, A. P. et al. "HTS Wire at Commercial Performance Levels." *IEEE Transactions on Applied Superconductivity*, Vol. 9, pp. 2469-2473 (1999)

[16] Dorris, S. E., Ashom, N., Truchan, T. & Vasanthamohan, N. "Coated-wire-in-tube processing of Bismuth-2223 superconductors." pp. 185-188 in Ceramic Transactions, Vol. 84, *Impact of Recent Advances in Processing of Ceramic Superconductors*. Edited by W. Wong-Ng, U. Balachandran and A. S. Bhala. American Ceramic Society, Westerville, Ohio, 1998

[17] Dai, W. et al. "Fabrication of High $T_C$ Coils from BSCCO 2212 Powder in Tube and Dip Coated Tape," *IEEE Trans. Applied Superconductivity*, Vol. 5, pp. 516-519 (1995)

[18] Marken, K. R. et al. "Progress in BSCCO-2212/Silver Composite Tape Conductors," *IEEE Trans. Applied Superconductivity*, Vol. 7, pp. 2211-2214 (1997)

[19] Hasegawa, T. et al. "Fabrication and Properties of $Bi_2Sr_2CaCu_2O_y$ Multilayer Superconducting Tapes and Coils," *IEEE Trans. Applied Superconductivity*, Vol. 7, pp. 1703-1706 (1997)

[20] Ilyushechkin, A. Y. et al. "Continuous Production of Bi-2212 Thick Film on Silver Tape," *IEEE Trans. Applied Superconductivity*, Vol. 9, pp. 1912-1915 (1999)

[21] Finnemore, D. K. et al. "Coated Conductor Development: an Assessment." *Physica C*, Vol. 320, 1-2, pp. 1-8 (July 1999)

[22] Hawsey, R. & Peterson, D. "Coated Conductors: The Next Generation of High-High $T_C$ Wires." *Superconductor Industry*, pp. 23-29 (Fall 1996)

[23] Paranthaman, M., P., Goyal, A., Feenstra, R., Izumi, T., & Selvamanickam, V., "MRS Superconductivity Workshop Explored Issues Related to Second-Generation YBCO-Coated Conductors." *MRS Bulletin*, pp. 812-814 (October 2002)

[24] Beaquis, S., Donet, S. & Weiss F. "Scaling-up of High-$T_C$ tapes by MOCVD, spray pyrolysis and MOD processes." pp. 53-64 in Ceramic Transactions, Vol. 140, *Processing of High Temperature Superconductors*. Edited by Amit Goyal, Winnie Wong-Ng, Masato Murakami & Judith Driscoll, American Ceramic Society, Westerville, Ohio, 2003

[25] King, A. et al. "Latest developments in using combustion chemical vapor deposition to fabricate coated conductors." pp. 91-101 in Ceramic Transactions, Vol. 140, *Processing of High Temperature Superconductors*. Edited by Amit Goyal, Winnie Wong-Ng, Masato Murakami & Judith Driscoll, American Ceramic Society, Westerville, Ohio, 2003

[26] Benneman, K. H. & Ketteson, J. B.—editors. *Conventional and High—$T_C$ Superconductors. The Physics of Superconductors*, Vol. I, Springer-Verlag, Berlin-London-New York, 966 pp. 2003

[27] Hill, R. W., Proust, C., Taillefer, L., Fournier, P. & Greene, R. L. "Breakdown of Fermi-liquid theory in a copper-oxide superconductor." *Nature, Vol.* 414, pp. 711-715 (2001)

[28] Zhou, X. J. et al. "High-temperature superconductors: Universal nodal Fermi velocity." *Nature, Vol.* 423, pp. 398 (2003)

[29] Coleman, P. "Superconductivity: Lifting the gossamer veil." *Nature*, Vol. 424, pp. 625-626 (2003)

[30] Navrotsky, A. "Materials and Nanotechnology." *MRS Bulletin*, pp. 92-94 (February 2003)

[31] Wang, Z., Lin, Y. & Zhang, Z., eds. *Handbook of Nanophase and Nanostructured Materials*. Vol. 1-Synthesis. Kluwer Academic/Plenum Publishers, New York. 316 pp. 2003

[32] Plass, R., Last, J. A., Bartelt, N. C. & Kellogg, G. L. "Nanostructures: Self-assembled domain patterns." *Nature*, Vol. 412, pp. 875 (2001)

[33] Seal, S. & Baraton, M-I., "Toward Applications of Ceramic Nanostructures." *MRS Bulletin*, Vol. 29, # 1, pp. 9-11 (2004)

[34] 10$^{th}$ *Anniversary Edition Product Guide*, Superconductivity Components, Inc., Columbus, Ohio, 79 pp or http://www.superconductivecomp.com/YBCO123SCPowders.htm

[35] Ginsberg, D. M., Editor. *Physical Properties of High Temperature Superconductors I*, World Scientific, Singapore-New Jersey-London-Hong Kong. 1989, 516 pp.

[36] http://www.ill.fr/dif/3D-crystals/superconductors.html

[37] Pizzi, A. & Mittal, K. L., eds., *Handbook of Adhesive Technology*. Marcel Dekker, New York, 1994, 586 pp.

[38] Aymonier, A. & Papon, E. "Designing Soft Reactive Adhesives by Controlling Polymer Chemistry." *MRS Bulletin*, pp. 424-427 (June 2003)

[39] Ishikawa, T., Yamaoka, H., Harada, Y., Fujii, T. & Nasagava, T. "A general process for in situ formation of functional surface layers on ceramics." *Nature* Vol. 416, pp. 64-67 (2002)

[40] Lopes, W. A. & Jaeger, H. M. "Hierarchical self-assembly of metal nanostructures on diblock copolymer scaffolds." *Nature* Vol. 414, pp. 735-738 (2001)

[41] Lang, K. M. et al. "Imaging the granular structure of high-$T_C$ superconductivity in underdoped $Bi_2Sr_2CaCu_2O_{8+\delta}$." *Nature* Vol. 415, pp. 412-416 (2002)

[42] Zhang, F. C. "Gossamer Superconductivity, Mott Insulator, and Resonating Valence Bond State in Correlated Electron Systems." *Physical Review Letters*. Vol. 90, pp. 207-210 (2003)

[43] Kitazawa, K. & Ishiguro, T. eds. *Advances in Superconductivity*, Proceedings of the 1$^{st}$ International Symposium on Superconductivity (ISS'88), 1988, Nagoya, Springer-Verlag, Berlin-Tokyo-. . . -New York, 1989. 920 pp.
[44] Ginzburg, V. L. "High-temperature Superconductivity (Dreams Come True)." *Priroda* (Nature) Moscow, Russia, # 7, pp. 16-30. (1987)—in Russian
[45] Ciszek, M. et al. "Energy Dissipation in High Temperature Ceramic Superconductors." *Applied Superconductivity*, Vol. 3, issue 7-10, pp. 509-520 (July 1995)
[46] Mitrovic, V. F. et al. "Spatially resolved electronic structure inside and outside the vortex cores of a high-temperature superconductor." *Nature*, Vol. 413, pp. 501-504 (2001)
[47] Jooss, Ch., Albrecht, J., Kuhn, H., Kronmuller, H. & Leonhardt, S. "Magneto-optical studies of current distributions in high $T_C$ superconductors." *Rep. Progress Phys.* Vol. 65, pp. 651 (2002)
[48] Lindsay, D. "Southwire High Temperature Superconducting Power Delivery System," *Superconductor & Cryoelectronics*, pp. 27-34 (Winter 2001)
[49] Weinstock, H. & Nisenoff, M. eds. *Superconducting Electronics*. Proceedings of the NATO Advanced Study Institute on Superconducting Electronics, held in Ciocco, Italy, June 26-Jul. 8, 1988. Springer-Verlag, Berlin-London-New York-Tokyo, 1989. 441 pp
[50] Reinolds III, T. G. "Electronic Ceramic Materials." *The American Ceramic Society Bulletin*, Vol. 80, # 10, pp. 29-33 (2001)

Following examples demonstrate advanced superconductive properties and the high usability of the newly produced sample prototypes of the sintered superconductor ceramic composite leads with controlled superconductive nano-architecture of the HTS-CSP macro material.

EXAMPLE 1

We employed the engineering measurement method, which allows integration of measured E Volt/cm vs. I Ampere function of all impacts of the direct electric current passing through the total cross-sections of the sintered HTS-CSP macro-leads of the length >1.5 cm. This method is described in ASTM B714-82 (90) (American Society for Testing and Materials, West Conshohocken, Pa.). Electric field E (V/cm) was measured with precision to 0.1 µV by HP 34401A Multimeter at increasing current I up to 20 A by CSi/SPECO PSR-50 DC Power Supply.

Calculation of the electric current density J$A/cm^2$ unifies results of E-I engineering measurements of the different leads to current lead cross-section of one $cm^2$, which makes possible quantitative comparison of electric current carrying capacities of the various current leads. Measurements comprising line 1 in FIG. 4a and FIG. 4b confirms the accuracy of our other measurements since electric resistivity of silver at 300K is shown as $\rho \sim 1.6 \cdot 10^{-6}$ Ohm·cm, which is very close to the handbook data.

A gradual increase of the supplied electric current for the HTS-CSP coated superconductor strand results in the slope of the E-I curve, which is smaller than the slope of the E-I graph at the same 77K (see FIG. 4a and FIG. 4b) for just the silver strand of the same diameter. The logarithmic scaled E-I graph of FIG. 4b determines the special point $I_\beta \sim 1$ A or $J_\beta \sim 6$ kA/$cm^2$ at very small E~0.0007V/cm. When supplied I>$I_\beta$, the E-I graph of the tested HTS-CSP strand becomes parallel with the E-I graph of the lonely tested silver substrate strand.

Meanwhile this HTS-CSP strand demonstrates the industrially desirable level J~10 kA/$cm^2$ at very small E~0.001V/cm. The same HTS-CSP strand could transfer practically without overheating I~18 A or J~106 kA/$cm^2$ at engineering usable voltage E~0.02V/cm. For comparison, J=1.5 kA/$cm^2$ burnt out the lonely tested silver strand of 127 µm in diameter at 300K and significantly overheated it at 77K.

EXAMPLE 2

FIG. 5. shows E-I behavior at 300K (graph # 1) and at 77K (graph # 2) of adhesion coated and sintered HTS-CSP strand using NiCr substrate strand of 50 µm in diameter. The cross-section of the HTS-CSP strands consists of a round strand substrate core and a ~10 µm-thck sintered cylinder-like coating layer. This hair-like thick and hair-like flexible HTS-CSP strand with superconductive nano-architecture of the HTS-CSP sintered coating layer can transfer direct electric current of I~0.7 A or J~20 kA/$cm^2$ at 77K and small E~0.005V/cm, which is an efficient and the highest engineering threshold level of current carrying capacity for highly beneficial industrial applications of such advanced strands. These strands can be woven into HTS wire or cable of any diameter and current carrying capacity.

EXAMPLE 3

FIG. 6 shows E-I behavior at 300K (graph # 1) and at 77K (graph # 2) of dry pressed and sintered HTS-CSP tablet/pellet. Comparison of these two graphs demonstrates significantly increased electric current carrying capability of the tested HTS-CSP bulk formed lead.

EXAMPLE 4

FIG. 7 is a photo picture of the rare-earth magnet (0.225 g, 5 mm in diameter) levitating in air, 7 mm above a dry-pressed and sintered HTS-CSP tablet/pellet of 30 mm in diameter immersed in liquid nitrogen.

EXAMPLE 5

FIG. 8 shows a magnified photo picture of silver substrate strand of 127 µm in diameter coated with the HTS-CSP sintered compound using YBCO raw powder particles. A part of the HTS-CSP adhesion coated and sintered HTS-CSP layer was intentionally removed to demonstrate HTS-CSP strand construction. The cross-section of the HTS-CSP strands consists of a strand substrate core circle and a ~10 µm-thck sintered ring-like coating layer.

EXAMPLE 6

FIG. 9 shows a photo picture of HTS-CSP slip cast formed and sintered HTS-CSP plate of the 20 mm×20 mm size.

It will be understood that each of the elements described above, or two or more together, may also find a useful application in other types of materials differing from the types described above.

While the invention has been illustrated and described as embodied in high temperature superconductor composite material, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A sintered high temperature superconducting (HTS) ceramic electric lead formed as three-dimensional (3D) HTS macro-ceramic solid product with honeycomb-like superconductive nano-architecture, comprising substantially uniformly aligned nano-size HTS ceramic crystal grains, silicate glass nano-thick films, and nano-size silver and/or inorganic dots that locate in nano-thick boundary areas of said superconductor ceramic crystal grains, and said nano-size films or dots provide honeycomb-like 3D nano-size network within said 3D HTS macro-ceramic solid product or HTS ceramic lead, and said electric lead is superconducting at liquid nitrogen cooling temperature, wherein said HTS ceramic crystal grains are composed of $YBa_2Cu_3O_{7-x}$ ceramic crystals, and an average number of oxygen atoms in a stoichiometric formula of $YBa_2Cu_3O_{7-x}$ ceramic crystals, where "x" may be varied in a range $0<x<0.3$, is so that it provides superconductivity of the HTS ceramic crystal grains and said sintered HTS ceramic lead or 3D HTS macro-ceramic product, wherein said HTS lead has the $YBa_2Cu_3O_{7-x}$ ceramic crystal grains having 10-25 nm in length.

2. A sintered HTS ceramic electric lead as defined in claim 1, wherein said ceramic crystal grains are fully dense sintered, which causes substantial decrease of the nano-thick grain boundary gaps and, consequently, facilitates Josephson junction or tunneling superconducting inter-grain effects, resulting in an electric current flux transfer between said sintered superconducting ceramic crystal grains that constitute superconductivity of the sintered 3D HTS macro-ceramics or said HTS ceramic electric lead.

3. A sintered HTS ceramic electric lead as defined in claim 1, wherein said 3D network of said silicate glass or silver or inorganic nano-size or nano-thick films and dots are configured, so that it facilitates 3D percolation and vortex-pinning network effects, resulting in an electric current flux transfer between said sintered superconducting ceramic crystal grains that constitute superconductivity of the sintered 3D HTS macro-ceramics or said HTS ceramic electric lead.

4. A sintered HTS ceramic electric lead as defined in claim 1, wherein said HTS lead comprises sintered $YBa_2Cu_3O_{7-x}$ ceramics coating nickel-chromium or NiCr or 'nichrome' alloy substrate strand, said HTS strand has the efficient substrate/ceramics cross-section ratio of about 1:1, and said HTS strand is configured so that it is reliably transfers electric current of 10-20 kA/cm$^2$ that 50-100× higher than engineering electric current carrying capability or capacity of the ordinary copper wire.

5. A sintered HTS ceramic electric lead as defined in. claim 1, wherein said HTS macro-ceramics comprise $YBa_2Cu_3O_{7-x}$ ceramics and achieve at liquid nitrogen cryogenic temperature an electric current carrying capability $\geqq 10^8$ Ampere/cm$^2$.

6. A sintered HTS ceramic electric lead as defined in claim 1, wherein said HTS macro-ceramics provide at liquid nitrogen cryogenic temperature substantial magnetic levitation or Meissner effect.

7. A sintered HTS ceramic electric lead as defined in claim 1, wherein under mechanical impacts said HTS macro-ceramics have the enhancing fracture toughness and ductility.

* * * * *